(12) United States Patent
Dogome et al.

(10) Patent No.: US 11,257,707 B2
(45) Date of Patent: Feb. 22, 2022

(54) SUBSTRATE GRIPPING MECHANISM, SUBSTRATE TRANSFER DEVICE, AND SUBSTRATE PROCESSING SYSTEM

(71) Applicant: TOKYO ELECTRON LIMITED, Tokyo (JP)

(72) Inventors: Masahiro Dogome, Nirasaki (JP); Keisuke Kondoh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 512 days.

(21) Appl. No.: 16/223,841

(22) Filed: Dec. 18, 2018

(65) Prior Publication Data

US 2019/0214289 A1 Jul. 11, 2019

(30) Foreign Application Priority Data

Jan. 5, 2018 (JP) .............................. JP2018-000681

(51) Int. Cl.
*H01L 21/687* (2006.01)
*B25J 9/16* (2006.01)
*H01L 21/67* (2006.01)
*B65G 47/90* (2006.01)
*H01L 21/677* (2006.01)
*B25J 18/04* (2006.01)

(52) U.S. Cl.
CPC ...... *H01L 21/68707* (2013.01); *B25J 9/1694* (2013.01); *B25J 18/04* (2013.01); *B65G 47/905* (2013.01); *H01L 21/67259* (2013.01); *H01L 21/67265* (2013.01); *H01L 21/67766* (2013.01)

(58) Field of Classification Search
None
See application file for complete search history.

(56) References Cited

U.S. PATENT DOCUMENTS

| 6,453,214 B1* | 9/2002 | Bacchi .............. H01L 21/68707 700/245 |
| 7,281,741 B2* | 10/2007 | Woodruff .......... H01L 21/67259 294/103.1 |
| 10,475,691 B2* | 11/2019 | Maruyama ........... B25J 15/0038 |

(Continued)

FOREIGN PATENT DOCUMENTS

| JP | 2002-134586 A | 5/2002 |
| JP | 2005-019761 A | 1/2005 |

(Continued)

*Primary Examiner* — Michael S Lowe
(74) *Attorney, Agent, or Firm* — Fenwick & West LLP

(57) ABSTRACT

A substrate gripping mechanism, for gripping a substrate between a fixed clamp portion to be engaged with an edge portion of a substrate and a movable clamp portion configured to reciprocate with respect to the fixed clamp portion by a reciprocating driving unit, includes an interlocking member configured to move together with the movable clamp portion, and a first sensor and a second sensor, each having a detection region and configured to detect whether or not the interlocking member exists in the detection region. The interlocking member has a first to a fourth portion connected in a reciprocating direction of the movable clamp portion. The first to the fourth portion have shapes to make detection results thereof by the first sensor and the second sensor different from each other.

6 Claims, 8 Drawing Sheets

(56) References Cited

U.S. PATENT DOCUMENTS

2003/0085582 A1* 5/2003 Woodruff .......... H01L 21/68707
　　　　　　　　　　　　　　　　　　　　294/103.1
2004/0018745 A1* 1/2004 Tashiro .................. H01L 21/68
　　　　　　　　　　　　　　　　　　　　438/758

FOREIGN PATENT DOCUMENTS

JP　　　　2015-026752 A　　2/2015
KR　　10-2017-0073477 A　　6/2017

* cited by examiner

SUBSTRATE GRIPPING MECHANISM, SUBSTRATE TRANSFER DEVICE, AND SUBSTRATE PROCESSING SYSTEM

CROSS-REFERENCE TO RELATED APPLICATION

This application claims priority to Japanese Patent Application No. 2018-000861 filed on Jan. 5, 2018, the entire contents of which is incorporated herein by reference.

FIELD OF THE INVENTION

The present disclosure relates to a substrate gripping mechanism for gripping a substrate to be transferred, a substrate transfer device, and a substrate processing system.

BACKGROUND OF THE INVENTION

In manufacturing a flat panel such as a semiconductor device, a liquid crystal display device or the like, a substrate transfer container accommodating substrates such as semiconductor wafers (hereinafter referred to as "wafers") or glass substrates is loaded into a loading port of a substrate processing system. Then, a substrate is unloaded from the substrate transfer container by a substrate transfer device of the substrate processing system, transferred to a processing device of the substrate processing system, and subjected to predetermined processing.

As for the substrate transfer device, there is known a substrate transfer device having a substrate gripping mechanism for gripping an edge portion of a substrate at the time of transferring the substrate (see Japanese Patent Application Publication No. 2002-134586).

The substrate gripping mechanism disclosed in Japanese Patent Application Publication No. 2002-134586 includes: a fixed clamp portion to be engaged with an edge portion on a leading end side of the substrate; a movable clamp portion movably provided at a position facing the fixed clamp portion with the substrate interposed therebetween and configured to hold the substrate; and a clamp cylinder configured to reciprocate the movable clamp portion. An automatic switch for confirming a clamp origin and an automatic switch for confirming a board clamp position are mounted on the clamp cylinder. In the substrate gripping mechanism disclosed in Japanese Patent Application Publication No. 2002-134586, the position of the movable clamp portion, i.e., an origin position before movement and a gripping position where the substrate is gripped between the fixed clamp portion and the movable clamp portion, can be confirmed by the switches. Further, in the substrate gripping mechanism disclosed in Japanese Patent Application Publication No. 2002-134586, an overstroke position where the movable clamp portion moves beyond the gripping position is also confirmed as the position of the movable clamp portion.

During a substrate transfer process, as for the state of the substrate gripping mechanism, it is preferable to accurately recognize a running state in which the movable clamp portion is moving between the origin position and the gripping position, as well as an open state in which the movable clamp portion is positioned at the origin position, a gripping state in which the movable clamp portion is positioned at a gripping position while gripping the substrate and a missing state in which the movable clamp portion is positioned at an overstroke position beyond the gripping position without gripping the substrate. This is because by accurately recognizing that the substrate gripping mechanism is in the running state, the transfer of a substrate between a substrate transfer device having the corresponding substrate gripping mechanism and another device can be started during the running state, not after the gripping state is shifted to the open state, which results in the increased throughput.

By employing the same structure as the substrate gripping mechanism disclosed in Japanese Patent Application Publication No. 2002-134586, the running state can be estimated. For example, it is estimated that the state of the wafer gripping mechanism is shifted to the running state when a predetermined period of time elapses after a signal for starting the operation of the movable clamp portion is transmitted to shift the gripping state of the substrate gripping mechanism to the open state. However, in this method, it is not possible to accurately recognize the running state. When the running state cannot be accurately recognized, if the substrate transfer operation is started in a state where the substrate gripping mechanism is in the gripping position, not in the running state, problems such as falling of the substrate, scratches of the substrate and the like occur.

Further, in the case of providing a large number of sensors, e.g., four sensors, in the substrate gripping mechanism, it is possible to accurately recognize the above-described four states, i.e., the open state, the gripping state, the missing state and the running state. Since, however, the space where the substrate transfer mechanism can be installed in the substrate transfer device is limited, it is difficult to provide a large number of sensors.

SUMMARY OF THE INVENTION

In view of the above, the present disclosure provides a substrate gripping mechanism capable of accurately recognizing four states, i.e., an open state, a gripping state, a missing state and a running state, with a small number of components, a substrate transfer device and a substrate processing system including the substrate gripping mechanism.

In accordance with an aspect, there is provided a substrate gripping mechanism for gripping a substrate between a fixed clamp portion to be engaged with an edge portion of a substrate and a movable clamp portion configured to reciprocate with respect to the fixed clamp portion by a reciprocating driving unit, the mechanism comprising: an interlocking member configured to move together with the movable clamp portion; and a first sensor and a second sensor, each having a detection region and configured to detect whether or not the interlocking member exists in the detection region, wherein the interlocking member has a first to a fourth portion connected in a reciprocating direction of the movable clamp portion, and the first to the fourth portion have shapes to make detection results thereof by the first sensor and the second sensor different from each other.

In accordance with another aspect, there is provided a substrate transfer device comprising: the substrate gripping mechanism described above; and a control unit configured to control the substrate gripping mechanism, wherein the control unit determines a state of the substrate gripping mechanism based on the detection results of the first sensor and the second sensor.

In accordance with still another aspect, there is provided a substrate processing system comprising: the substrate transfer device described above; and a processing device configured to perform predetermined processing on a substrate transferred by the substrate transfer device.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
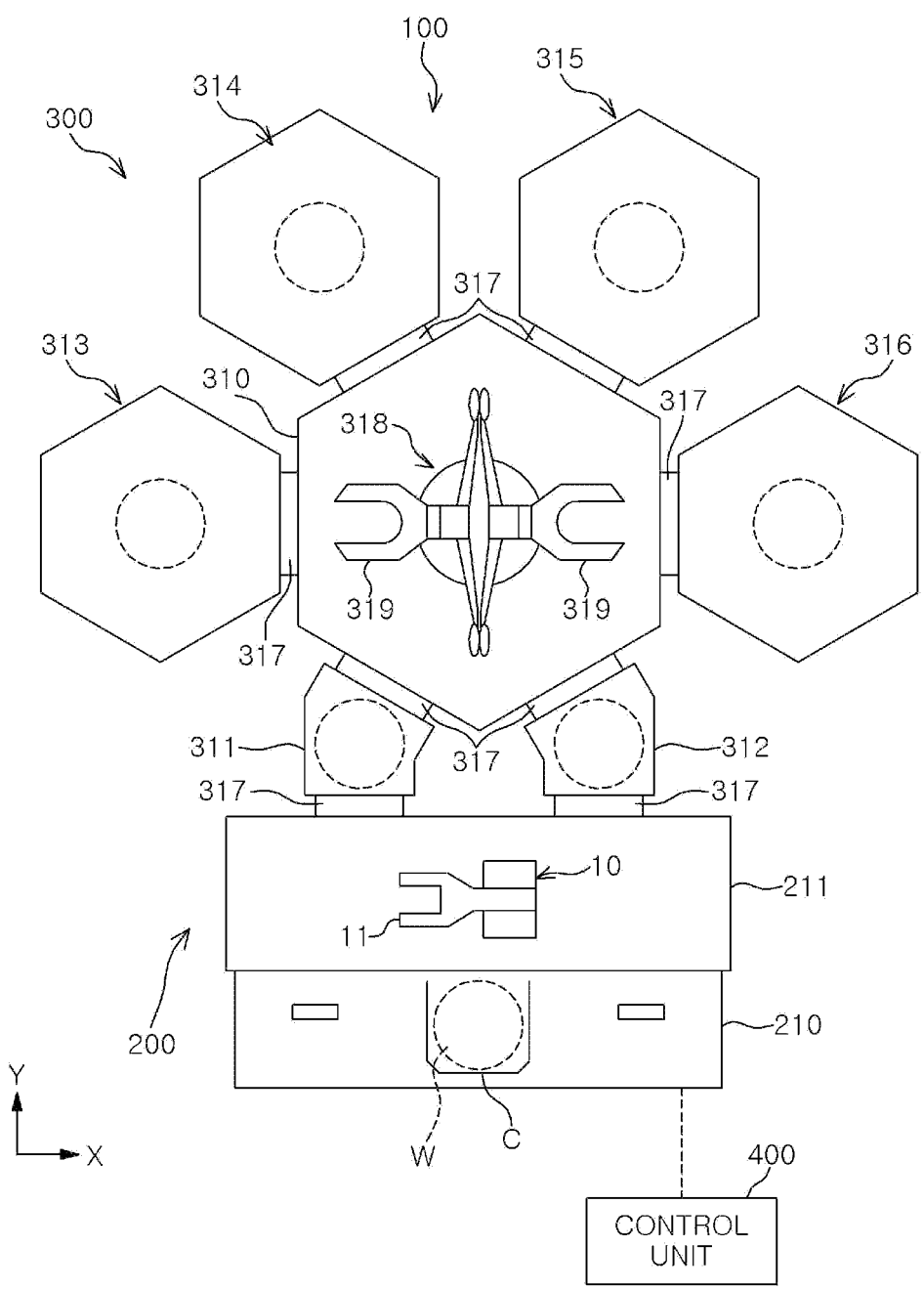
FIG. 1 is a plan view schematically showing a configuration of a substrate processing system according to an embodiment.

Hereinafter, embodiments will be described in detail with reference to the accompanying drawings. Like reference numerals will be given to like or corresponding parts throughout this specification and the drawings, and redundant description thereof will be omitted.

First, a configuration of a substrate processing system according to an embodiment will be described. FIG. 1 is a plan view schematically showing a configuration of a substrate processing system 100.

As shown in FIG. 1, the substrate processing system 100 has a configuration in which a cassette station 200 for loading and unloading wafers W as substrates on a cassette basis and a processing station 300 having a plurality of processing devices for processing wafers W one by one are connected integrally.

The cassette station 200 includes a cassette mounting unit 210 and a transfer chamber 211. A plurality of, e.g., three, cassettes C each of which is capable of accommodating a plurality of wafers W therein can be arranged in the X direction (the right-left direction in FIG. 1) on the cassette mounting unit 210. The transfer chamber 211 is adjacent to the positive side of the Y direction (upper side in FIG. 1) of the cassette mounting unit 210. In the transfer chamber 211, a wafer transfer device 10 is provided as a substrate transfer device for transferring the wafer W. The wafer transfer device 10 in the transfer chamber 211 includes a multi-joint transfer arm 11 capable of rotating, extending and contracting. The wafer transfer device 10 can transfer the wafer W to the cassettes C of the cassette mounting unit 210 and load-lock chambers 311 and 312 of the processing station 300 which will be described later. The operation of the wafer transfer device 10 is controlled by a control unit 400 to be described later.

A main transfer chamber 310 of which inner pressure can be decreased is provided at the central portion of the processing station 300. The main transfer chamber 310 has, e.g., a substantially hexagonal shape when viewed from the top. The load-lock chambers 311 and 312, four processing devices 313, 314, 315 and 316 are connected to the main transfer chamber 310.

The load-lock chambers 311 and 312 are disposed between the main transfer chamber 310 and the transfer chamber 211 of the cassette station 200. The load-lock chambers 311 and 312 connect the main transfer chamber 310 and the transfer chamber 211. The load-lock chambers 311 and 312 have a mounting portion (not shown) for the wafer W. The inside of the load-lock chambers 311 and 312 can be maintained in a depressurized atmosphere.

Openable and closeable gate valves 317 are provided between the transfer chamber 211 and the load-lock chambers 311 and 312, between the main transfer chamber 310 and the load-lock chambers 311 and 312, and between the main transfer chamber 310 and the processing devices 313 to 316 to airtightly seal the spaces therebetween.

A vacuum wafer transfer device 318 is provided in the main transfer chamber 310. The vacuum wafer transfer device 318 has, e.g., two transfer arms 319. Each transfer arm 319 is configured to be rotatable, extensible and contractible, and can transfer the wafer W to the load-lock chambers 311, 312 and the processing devices 313 to 316 around the main transfer chamber 310. The operation of transferring the wafer W by the vacuum wafer transfer device 318 is controlled by the control unit 400 to be described later. The processing devices 313 to 316 are plasma processing devices for performing predetermined processing, e.g., plasma processing, based on a predetermined processing recipe. The processing of the wafers W in the processing devices 313 to 316 is controlled by the control unit 400 to be described later.

The substrate processing system 100 includes the control unit 400 for controlling the wafer transfer devices 313 to 316, and the like. The control unit 400 is, e.g., a computer, and has a program storage unit (not shown). A program for controlling the operation of the wafer transfer device 10 or the like is stored in the program storage unit. The program is stored in a computer-readable storage medium, e.g., a hard disk (HD), a flexible disk (FD), a compact disk (CD), a magnet optical disk (MO), a memory card or the like, and may be installed in the control unit 400 from the storage medium.

Figure 2:
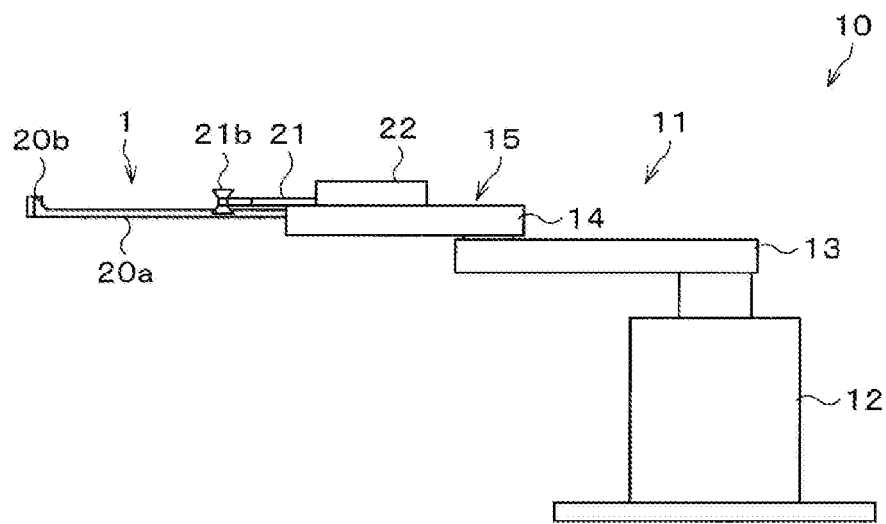
FIG. 2 is a side view schematically showing a configuration of a wafer transfer device shown in FIG. 1.

Hereinafter, the configuration of the wafer transfer device 10 will be described. FIG. 2 is a side view schematically showing the configuration of the wafer transfer device 10. As shown in FIG. 2, the wafer transfer device 10 includes a base 12 and a transfer arm 11.

The base 12 is configured to be movable horizontally and vertically by a driving unit (not shown).

The transfer arm 11 is configured to be rotatable, extensible and contractible. The transfer arm 11 has a first arm 13 and a second arm 14.

The first arm 13 is connected at its base end to the base 12 to be rotatable about a vertical axis.

The second arm 14 is connected to the leading end of the first arm 13 to be rotatable about the vertical axis. The second arm 14 has a wafer gripping mechanism 1 having at its base end an installation unit 15 in which various components are installed. The wafer gripping mechanism 1 serves as a substrate gripping mechanism for gripping the wafer W during the transfer of the wafer W.

Figure 3:
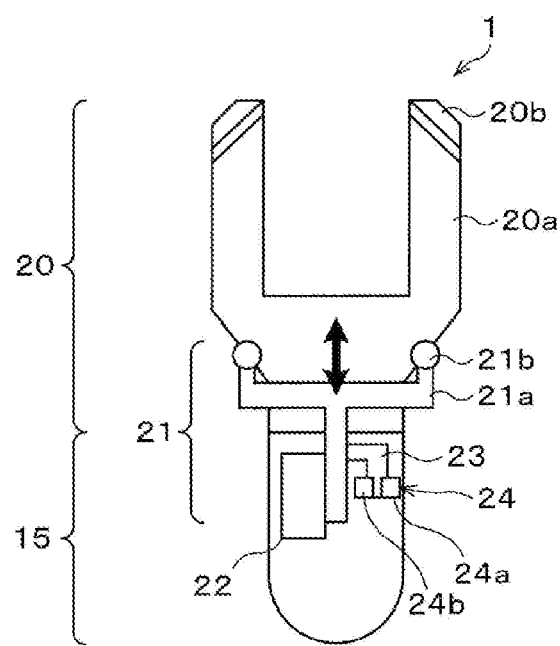
FIG. 3 is a plan view schematically showing a configuration of a wafer gripping mechanism shown in FIG. 2.

FIG. 3 is a plan view schematically showing the configuration of the wafer gripping mechanism 1.

As shown in FIG. 3, the wafer gripping mechanism 1 includes a fork 20, a pusher 21, an actuator 22, a kicker 23, and a detection unit 24. The actuator 22, the kicker 23, and the detection unit 24 are installed in the installation unit 15. A component mounting space of the mounting unit 15 is covered with a casing (not shown). Therefore, even if particles are generated from the components installed in the mounting unit 15, it is possible to prevent the particles from affecting the wafer W.

The fork 20 has a Y-shaped fork main body 20a extending from the mounting unit 15 and having bifurcated leading ends. A fixed clamp portion 20b is formed at each of the bifurcated ends of the fork main body 20a.

Figure 4:
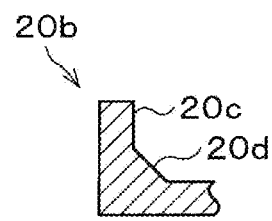
FIG. 4 is a partially enlarged cross sectional view of a fixed clamp portion of a fork shown in FIG. 3.

FIG. 4 is a partially enlarged cross sectional view of the fixed clamp portion 20b of the fork 20.

The fixed clamp portion 20b has a vertical wall 20c extending in a vertical direction, and an inclined wall 20d extending from the lower end of the vertical wall 20c to be inclined toward the base end of the fork 20. In order to grip the wafer W by the wafer gripping mechanism 1, first, the wafer W is put on the inclined wall 20d such that the lower end of the edge portion of the wafer W is brought into contact with the inclined wall 20d. Thereafter, the movable clamp portion 21b of the pusher 21 which will be described later moves toward the fixed clamp portion 20b. Accordingly, the wafer W is smoothly moved up on the inclined wall 20d. Then, the wafer W is gripped at the portion where the edge portion of the wafer W is brought into direct contact with the vertical wall 20c.

Referring back to FIG. 3, the pusher 21 has a pusher main body 21a having bifurcated leading ends. A movable clamp portion 21b is provided at each of the bifurcated leading ends of the pusher main body 21a. The base end of the pusher main body 21a is connected to the actuator 22.

The actuator 22 is a reciprocating driving unit for reciprocating the pusher main body 21a, i.e., the movable clamp portion 21b, with respect to the fixed clamp portion 20b. The actuator 22 is, e.g., an air cylinder. The actuator 22 may also be a linear motor or a linear solenoid.

In the wafer gripping mechanism 1, the wafer W can be gripped between the fixed clamp portion 20b and the movable clamp portion 21b that reciprocates with respect to the fixed clamp portion 20b by the actuator 22.

Figure 5:
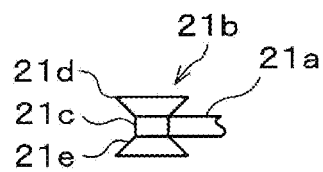
FIG. 5 is a partially enlarged side view of a movable clamp portion of a pusher shown in FIG. 3.

FIG. 5 is a partially enlarged side view of the movable clamp portion 21b of the pusher 21.

As shown in FIG. 5, the movable clamp portion 21b has an upper truncated cone-shaped portion 21d whose diameter increases toward the top, a lower truncated cone-shaped portion 21e whose diameter increases toward the bottom, and a cylindrical portion 21c provided between the upper truncated cone-shaped portion 21d and the lower truncated cone-shaped portion 21e. In order to grip the wafer W by the wafer gripping mechanism 1, as the movable clamp portion 21b moves forward, i.e., toward the fixed clamp portion 20b, the wafer W is put on the lower truncated cone-shaped portion 21e in a state where the lower end of the edge portion of the wafer W is brought into direct contact with the lower truncated cone-shaped portion 21e. Then, as the movable clamp portion 21b moves forward further, the wafer W is smoothly moved up on the inclined surface of the lower truncated cone-shaped portion 21e and the wafer W is gripped in the state where the edge portion of the wafer W are brought into direct contact with the cylindrical portion 21c.

Referring back to FIG. 3, the kicker 23 moves together with the pusher 21, i.e., the movable clamp portion 21b. In this example, the kicker 23 is formed separately from the pusher 21 and attached to the pusher 21 to move together with the pusher 21.

The detection unit 24 detects the position of the kicker 23 in the reciprocating direction of the movable clamp unit 21b. The detection unit 24 includes a first sensor 24a and a second sensor 24b.

Figure 6:
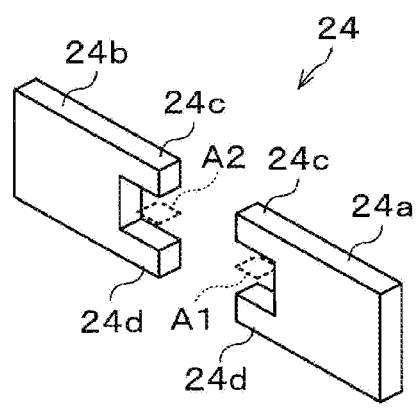
FIG. 6 is a perspective view schematically showing a configuration of a detection unit shown in FIG. 3.

FIG. 6 is a perspective view schematically showing the configuration of the detection unit 24.

As shown in FIG. 6, the first sensor 24a and the second sensor 24b of the detection unit 24 have detection regions A1 and A2, respectively. The first sensor 24a and the second sensor 24b detect whether or not the kicker 23 exists in the detection regions A1 and A2, respectively. The first sensor 24a is provided such that the detection region A1 is located in a region where the kicker 23 can exist. The second sensor 24b is provided such that the detection region A2 is located in a region where the kicker 23 can exist.

The first sensor 24a and the second sensor 24b are, e.g., photointerrupters, and have a light emitting portion 24c and a light receiving portion 24d facing each other with the region where the kicker 23 can exist therebetween.

Figure 7:
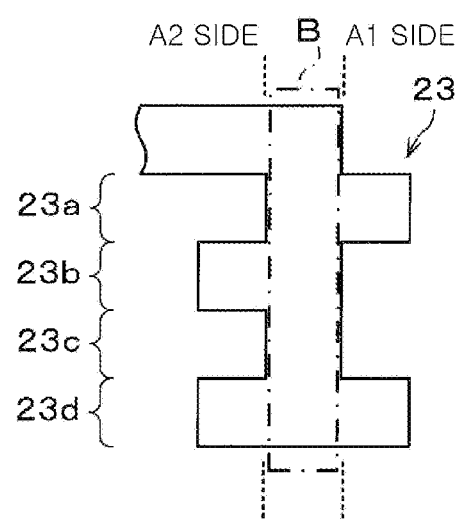
FIG. 7 is a plan view schematically showing a configuration of a kicker shown in FIG. 3.

FIG. 7 is a plan view schematically showing a configuration of the kicker 23.

The kicker 23 has first to fourth portions 23a to 23d connected in the reciprocating direction (vertical direction in FIG. 3) of the movable clamp portion 21b. When the first to the fourth portion 23a to 23d are each located in the detection unit 24, different detection results are obtained by the first sensor 24a and the second sensor 24b.

Among the first to the fourth portion 23a to 23d, the first portion 23a located at the outermost end extends toward the detection region A1 (right side in FIG. 7) of the first sensor 24a from a central region B extending in the reciprocating direction. When the first portion 23a is positioned in the detection unit 24, it is detected only by the first sensor 24a.

The second portion 23b extends from the central region B toward the detection region A2 (left side in FIG. 7) of the second sensor 24b. When the second portion 23b is positioned in the detection unit 24, it is detected only by the second sensor 24b.

The third portion 23c does not extend from the central region B toward any of the detection region A1 and the detection region A2 (the right side and the left side in FIG. 7). When the third portion 23c is positioned in the detection unit 24, it is not detected by any of the first sensor 24a and the second sensor 24b.

The fourth portion 23d extends from the central region B toward both of the detection region A1 and the detection region A2 (the right side and the left side in FIG. 7). When the fourth portion 23d is positioned in the detection unit 24, it is detected by both of the first sensor 24a and the second sensor 24b.

Hereinafter, the relation between the state of the wafer gripping mechanism 1 having the above-described components and the detection states of the first sensor 24a and the second sensor 24b will be described with reference to FIGS. 8A to 11B.

(Open State)

Figure 8A:
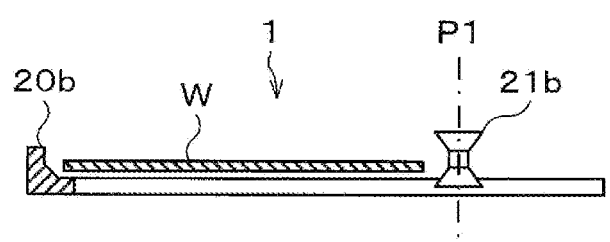
FIGS. 8A and 8B shows relation between a state of the wafer gripping mechanism and detection states of a first and a second sensor.
Figure 8B:
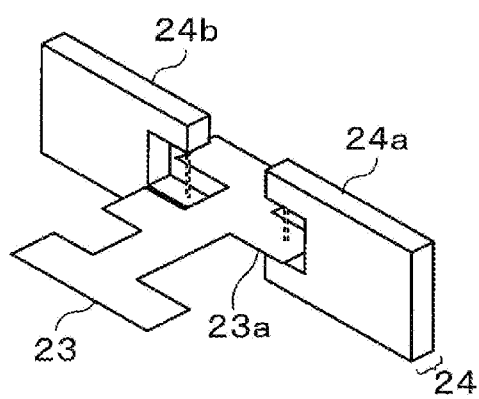

When the wafer gripping mechanism 1 is in the open state, i.e., when the movable clamp portion 21b is positioned at the origin position P1, as shown in FIG. 8A, the first portion 23a of the kicker 23 moving together with the movable clamp portion 21b is positioned in the detection unit 24 as shown in FIG. 8B. Therefore, when the wafer gripping mechanism 1 is the open state, the existence of the kicker 23 is detected only by the first sensor 24a.

(Gripping State)

Figure 9A:
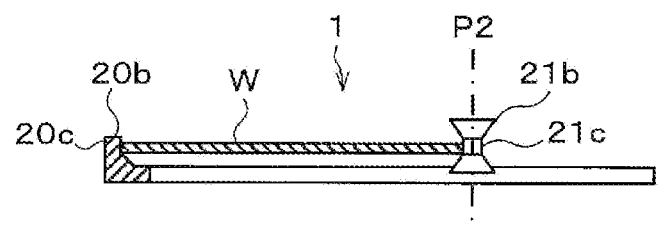
FIGS. 9A and 9B show another relation between the state of the wafer gripping mechanism and the detection states of the first and the second sensors.
Figure 9B:
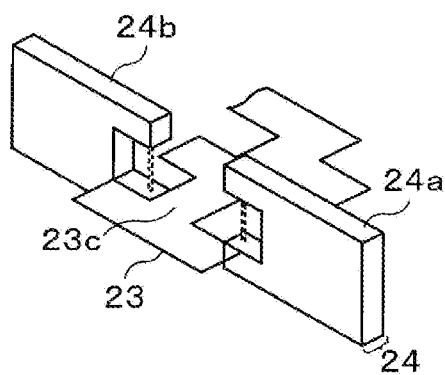

On the other hand, when the wafer gripping mechanism 1 is in the gripping state, i.e., when the movable clamp portion 21b is positioned at a gripping position P2 where the cylindrical portion 21c of the movable clamp portion 21b and the vertical wall 20c of the fixed clamp portion 20b are in direct contact with the edge of the wafer W and the wafer W is gripped by the movable clamp portion 21b and the fixed clamp portion 20b as shown in FIG. 9A, the third portion 23c of the kicker 23 moving together with the movable clamp portion 21b is positioned in the detection unit 24 as shown in FIG. 9B. Therefore, when the wafer gripping mechanism 1 is in the gripping state, the existence of the kicker 23 is not detected by any of the first sensor 24a or the second sensor 24b.

(Missing State)

Figure 10A:
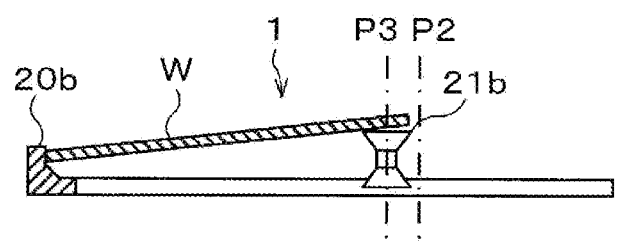
FIGS. 10A and 10B show still another relation between the state of the wafer gripping mechanism and the detection states of the first and the second sensors.
Figure 10B:
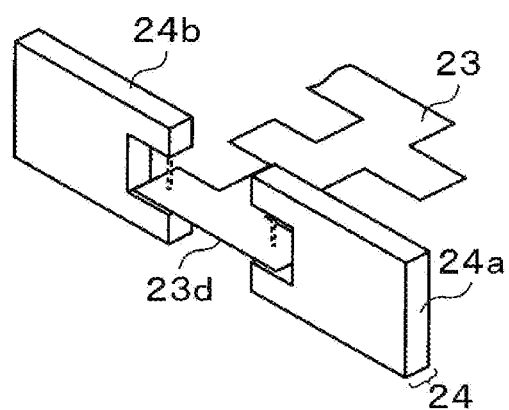

When the wafer gripping mechanism 1 is the missing state, i.e., when the movable clamp portion 21b is positioned at an overstroke position P3 beyond the gripping position P2 without gripping the wafer W as shown in FIG. 10A, the fourth portion 23d of the kicker 23 moving together with the movable clamp portion 21b is located in the detection unit 24 as shown in FIG. 10B. Therefore, when the wafer gripping mechanism 1 is in the missing state, the existence of the kicker 23 is detected by both of the first sensor 24a and the second sensor 24b.

(Running State)

Figure 11A:
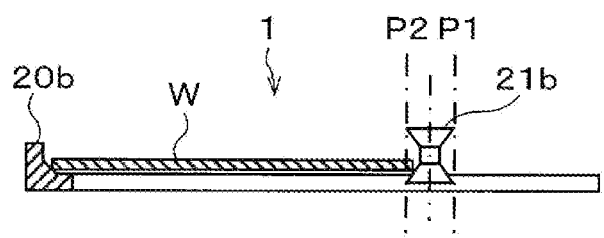
FIGS. 11A and 11B show further still another relation between the state of the wafer gripping mechanism and the detection states of the first and the second sensors.
Figure 11B:
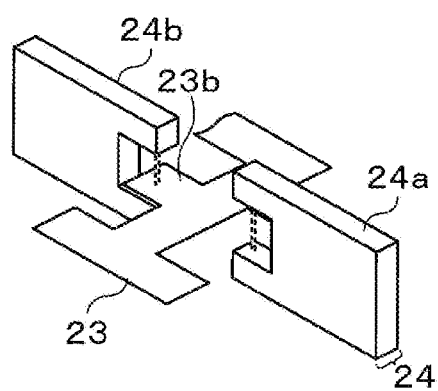

When the wafer gripping mechanism 1 is in the running state, i.e., when the movable clamp portion 21b is positioned between the origin position P1 and the gripping position P2, more specifically, when the movable clamp portion 21b is positioned between a position separated from the origin position P1 by a predetermined distance toward the leading end and a position separated from the gripping position P2 by a predetermined distance toward the base end as shown in FIG. 11A, the second portion 23b of the kicker 23 is positioned in the detection unit 24 as shown in FIG. 11B. Therefore, when the wafer gripping mechanism 1 is in the running state, the kicker 23 is detected only by the second sensor 24b.

As described above, in accordance with the wafer gripping mechanism 1, different detection results are obtained by the first sensor 24a and the second sensor 24b depending on the state of the wafer gripping mechanism 1 which is determined among the open state, the gripping state, the missing state and the running state.

Therefore, in the wafer transfer device 10 having the wafer gripping mechanism 1, the control unit 400 can determine the state of the wafer gripping mechanism 1 based on the detection results of the first sensor 24a and the second sensor 24b.

Hereinafter, an example of a process of transferring a wafer W by the wafer transfer device 10 in the substrate processing system 100 will be described.

First, the fork 20 is inserted in the cassette on the cassette mounting unit 210 and moved to be positioned below the wafer W. In this stage, the wafer gripping mechanism 1 is in the open state.

Then, the fork 20 is raised and, thus, the fixed clamp portion 20b and the movable clamp portion 21b become close to the edge portion of the wafer W.

Next, the control unit 400 outputs a signal for starting movement toward the leading end to the actuator 22 and allows the pusher 21, i.e., the movable clamp portion 21b, to move toward the leading end of the fork 20. Accordingly, the edge portion of the wafer W is brought into direct contact with the inclined wall 20d of the fixed clamp portion 20b and the lower truncated cone-shaped portion 21e of the movable clamp portion 21b. Then, as the movable clamp portion 21b moves further, the leading end portion of the wafer W is raised along the inclined wall 20d of the fixed clamp portion 20b and the base end portion of the wafer W is raised along the inclined surface of the lower truncated cone-shaped portion 21e of the movable clamp portion 21b. The leading end portion of the wafer W is raised until the edge portion of the leading end becomes in direct contact with the vertical wall 20c of the fixed clamp portion 20b, and the base end portion of the wafer W is raised until the edge portion of the base end becomes in direct contact with the cylindrical portion 21c of the movable clamp portion 21b.

When a predetermined period of time elapses from the output of the signal for starting movement toward the leading end, the control unit 400 detects the state of the wafer gripping mechanism 1 based on the detection results of the first sensor 24a and the second sensor 24b.

If it is determined that the kicker 23 is detected by both of the first sensor 24a and the second sensor 24b and the wafer gripping mechanism 1 is in the missing state, the control unit 400 informs an operator of the substrate processing system 100 of the information indicating that the wafer gripping mechanism 1 is in the missing state. For example, the control unit 400 controls a display unit (not shown) to display an error message.

If it is determined that the kicker 23 is not detected by any of the first sensor 24a and the second sensor 24b and the wafer gripping mechanism 1 is in the gripping state, the fork 20 retreats from the cassette C. Then, the fork 20 enters the load-lock chamber 311 and moves to a position above a mounting unit (not shown) of the wafer W.

Then, the control unit 400 outputs a signal for starting movement toward the base end to the actuator 22 and starts movement of the pusher 21, i.e., the movable clamp unit 21b, toward the base end of the fork 20.

Thereafter, the control unit 400 determines the state of the wafer gripping mechanism 1 based on the detection results of the first sensor 24a and the second sensor 24b at a predetermined interval. If it is determined that the kicker 23 is detected only by the second sensor 24b and the wafer gripping mechanism 1 is in the running state, the transfer of the wafer W from the fork 20 to the mounting unit in the load-lock chamber 311 W is started. Specifically, the lowering operation of the fork 20 is started.

When the lowering operation is completed, the fork 20 retreats from the load-lock chamber 311. The fork 20 may retreat therefrom after the wafer gripping mechanism 1 is in the open state or before the wafer gripping mechanism 1 is in the open state.

In accordance with the present embodiment, the four states of the wafer gripping mechanism 1, i.e., the open state, the gripping state, the missing state, and the running state, can be accurately recognized. Therefore, the wafer W can be prevented from being transferred without being gripped, and the operation of transferring the substrate between the wafer transfer device 10 and another device can be started from the running state, not after the gripping state is shifted to the open state. Accordingly, the throughput can be improved. Further, in accordance with the present embodiment, whether or not the wafer gripping mechanism 1 is in the running state is not estimated but determined. In other words, whether or not the gripping state of the wafer gripping mechanism 1 is released can be more reliably recognized. Therefore, a drawback caused when it is not possible to recognize that the gripping state of the wafer gripping mechanism 1 is not released can be solved. For example, it is possible to prevent the transfer operation from being performed in a state where the gripping state is not released. In other words, the operation following the operation in the gripping state can be reliably performed.

Moreover, in accordance with the present embodiment, four sensors are required to recognize the four states. In other words, in accordance with the present embodiment, the four states can be accurately recognized with a small number of components. Therefore, the wafer gripping mechanism 1 of the present embodiment can be installed at a substrate transfer device having a small space in which components can be installed, i.e., a small installation unit 15.

As for a method of recognizing the four states, there is considered a method of recognizing the four states based on a detection result of a linear encoder for accurately detecting a position in a reciprocating direction of the pusher 21. However, the linear encoder is expensive. If the first sensor 24a and the second sensor 24b can detect whether or not the kicker 23 exists in the detection regions A1 and A2, it is possible to employ a cost-effective sensor.

Although it is preferable that the components installed on the arm (the second arm 14) of the wafer transfer device 10 are lightweight, the linear encoder is heavy. By employing the first sensor 24a and the second sensor 24b that are photointerrupters or the like, the weight can be reduced. Although the resolution of a commercial linear encoder is at most 0.5 mm, such resolution is not required in recognizing the four states.

In the above description, the first sensor 24a and the second sensor 24b are photointerrupters, but the first sensor 24a and the second sensor 24b are not limited thereto and may be a non-contact type sensor. In the case of employing a contact type sensor, the sensor becomes a dust source and may affect the wafer processing. However, such a drawback can be prevented by using a non-contact type sensor.

In the above description, when the shape detected by both of the first sensor 24a and the second sensor 24b is set to a first shape; the shape detected only by the first sensor 24a is set to a second shape; the shape detected only by the second sensor 24b is set to a third shape; and the shape that is not detected by any of the first sensor 24a and the second sensor 24b is set to a fourth shape, the first portion 23a of the kicker 23 has the second shape; the second portion 23b has the third shape; the third portion 23c has the fourth shape; and the fourth portion 23d has the first shape. However, the shapes of the first to the fourth portions 23a to 23d are not limited thereto. The first to the fourth portion 23a to 23d of the kicker 23 may have different shapes and may each have any one of the first to the fourth shape.

In the above description, the pusher main body 21a and the kicker 23 are separate components. In other words, the pusher main body 21a and an interlocking member of the present disclosure are separate components. However, the pusher main body 21a itself may be the interlocking member of the present disclosure and have a first to a fourth portion connected along the reciprocating direction of the movable clamp portion 21b. The first to the fourth portion may have different shapes and may each have any one of the first to the fourth shape.

While the present disclosure has been shown and described with respect to the embodiments, it will be understood by those skilled in the art that various changes and modifications may be made without departing from the scope of the present disclosure as defined in the following claims.

The present disclosure is effectively used for a technique for transferring a substrate.

What is claimed is:

1. A substrate gripping mechanism for gripping a substrate between a fixed clamp portion to be engaged with an edge portion of a substrate and a movable clamp portion configured to reciprocate with respect to the fixed clamp portion by a reciprocating driving unit, the mechanism comprising:
    an interlocking member configured to move together with the movable clamp portion;
    a first sensor having a first detection region and configured to detect whether or not the interlocking member exists in the first detection region; and
    a second sensor having a second detection region and configured to detect whether or not the interlocking member exists in the second detection region,
    wherein the interlocking member has a first to a fourth portion connected in a reciprocating direction of the movable clamp portion,
    the first to the fourth portion have shapes to make detection results thereof by the first sensor and the second sensor different from each other,
    the interlocking member has a central region extending in the reciprocating direction, an extension portion extending toward the first detection region from the central region and an extension portion extending toward the second detection region from the central region, and
    the first sensor and the first detection region are provided at one of a left side and right side of the central region of the interlocking member and the second sensor and the second detection region are provided at the other of the left side and right side of the central region of the interlocking member.

2. The substrate gripping mechanism of claim 1, wherein the first to the fourth portion of the interlocking member have different shapes and each have any one of a first to a fourth shape, and
    wherein the first shape is detected by both the first sensor and the second sensor; the second shape is detected only by the first sensor; the third shape is detected only by the second sensor; and the fourth shape is not detected by any of the first sensor and the second sensor.

3. The substrate gripping mechanism of claim 2, wherein the first sensor and the second sensor are non-contact type sensors.

4. A substrate transfer device comprising:
    a substrate gripping mechanism for gripping a substrate between a fixed clamp portion to be engaged with an edge portion of a substrate and a movable clamp portion configured to reciprocate with respect to the fixed clamp portion by a reciprocating driving unit, the mechanism comprising:
        an interlocking member configured to move together with the movable clamp portion;
        a first sensor having a first detection region and configured to detect whether or not the interlocking member exists in the first detection region; and
        a second sensor having a second detection region and configured to detect whether or not the interlocking member exists in the second detection region, wherein the interlocking member has a first to a fourth portion connected in a reciprocating direction of the movable clamp portion, the first to the fourth portion have shapes to make detection results thereof by the first sensor and the second sensor different from each other, the interlocking member has a central region extending in the reciprocating direction, an extension portion extending toward the first detection region from the central region and an extension portion extending toward the second detection region from the central region, and the first sensor and the first detection region are provided at one of a left side and right side of the central region of the interlocking member and the second sensor and the second detection region are provided at the other of the left side and right side of the central region of the interlocking member; and a control unit configured to control the substrate gripping mechanism, wherein the control unit determines a state of the substrate gripping mechanism based on the detection results of the first sensor and the second sensor.

5. The substrate transfer device of claim 4, wherein the state of the substrate gripping mechanism determined by the control unit is any one of an open state, a running state, a gripping state and a missing state.

6. A substrate processing system comprising:

a substrate gripping mechanism for gripping a substrate between a fixed clamp portion to be engaged with an edge portion of a substrate and a movable clamp portion configured to reciprocate with respect to the fixed clamp portion by a reciprocating driving unit, the mechanism comprising:

an interlocking member configured to move together with the movable clamp portion; and a first sensor having a first detection region and configured to detect whether or not the interlocking member exists in the first detection region; and a second sensor having a second detection region and configured to detect whether or not the interlocking member exists in the second detection region, wherein the interlocking member has a first to a fourth portion connected in a reciprocating direction of the movable clamp portion, the first to the fourth portion have shapes to make detection results thereof by the first sensor and the second sensor different from each other, the interlocking member has a central region extending in the reciprocating direction, an extension portion extending toward the first detection region from the central region and an extension portion extending toward the second detection region from the central region, and the first sensor and the first detection region are provided at one of a left side and right side of the central region of the interlocking member and the second sensor and the second detection region are provided at the other of the left side and right side of the central region of the interlocking member; and a control unit configured to control the substrate gripping mechanism; and a processing device configured to perform predetermined processing on a substrate transferred by the substrate transfer device, wherein the control unit determines a state of the substrate gripping mechanism based on the detection results of the first sensor and the second sensor.

\* \* \* \* \*